United States Patent
Arnold et al.

(10) Patent No.: US 10,685,879 B1
(45) Date of Patent: Jun. 16, 2020

(54) LITHOGRAPHIC ALIGNMENT OF A CONDUCTIVE LINE TO A VIA

(71) Applicant: INTERNATIONAL BUSINESS MACHINES CORPORATION, Armonk, NY (US)

(72) Inventors: John C. Arnold, North Chatham, NY (US); Ashim Dutta, Menands, NY (US); Dominik Metzler, Saratoga Springs, NY (US); Takeshi Nogami, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/541,873

(22) Filed: Aug. 15, 2019

(51) Int. Cl.
*H01L 21/768* (2006.01)
*H01L 23/522* (2006.01)
*H01L 23/528* (2006.01)

(52) U.S. Cl.
CPC .. *H01L 21/76892* (2013.01); *H01L 21/76816* (2013.01); *H01L 21/76819* (2013.01); *H01L 21/76877* (2013.01); *H01L 23/5226* (2013.01); *H01L 23/5283* (2013.01)

(58) Field of Classification Search
None
See application file for complete search history.

(56) References Cited

U.S. PATENT DOCUMENTS

| | | | |
|---|---|---|---|
| 8,299,625 B2 | 10/2012 | Ponoth et al. | |
| 8,357,609 B2 | 1/2013 | Ryan | |
| 9,324,650 B2 | 4/2016 | Edelstein et al. | |
| 9,502,350 B1 | 11/2016 | Bonilla et al. | |
| 9,601,426 B1 | 3/2017 | Bonilla et al. | |
| 9,761,489 B2 | 9/2017 | Mebarki et al. | |
| 10,020,223 B1 | 7/2018 | Anderson et al. | |
| 10,177,031 B2 | 1/2019 | Bao et al. | |
| 2013/0069244 A1* | 3/2013 | Blatchford | H01L 23/528 257/774 |
| 2017/0162437 A1 | 6/2017 | Rubin et al. | |
| 2019/0035677 A1 | 1/2019 | Chandhok et al. | |

* cited by examiner

*Primary Examiner* — J. E. Schoenholtz
(74) *Attorney, Agent, or Firm* — Tutunjian & Bitetto, P.C.; Vazken Alexanian

(57) ABSTRACT

A method for fabricating a semiconductor device includes forming misalignment tolerant vias each having a landing area configured to account for alignment mismatch resulting from subsequent formation of conductive structures, depositing a conductive layer over the misalignment tolerant vias, and obtaining conductive layer patterning including each of the conductive structures formed on at least a portion of a respective one of the landing areas, including subtractively patterning the conductive layer. The misalignment tolerant vias and the conductive structures imparting a semiconductor device geometry accounting for the alignment mismatch.

19 Claims, 9 Drawing Sheets

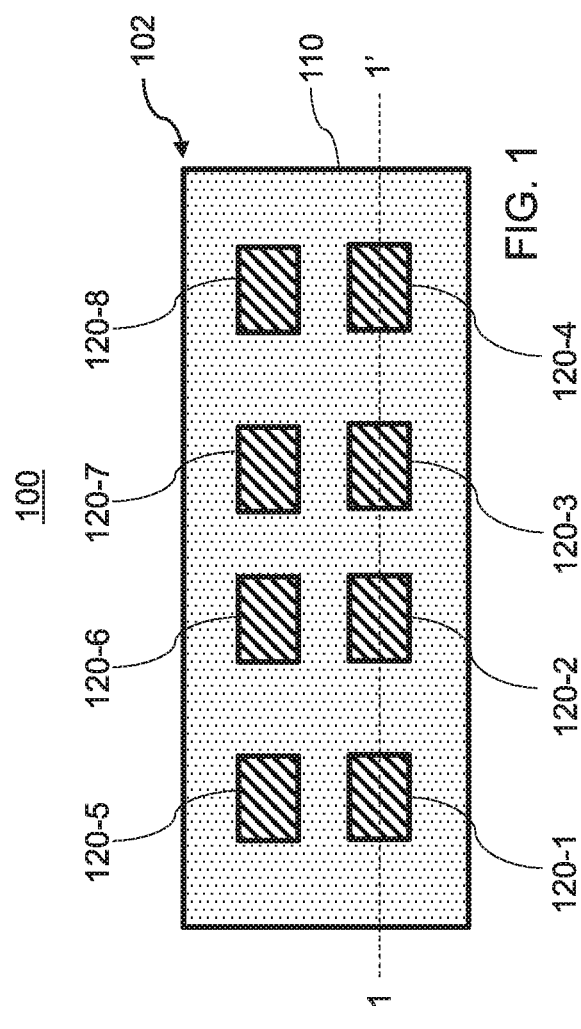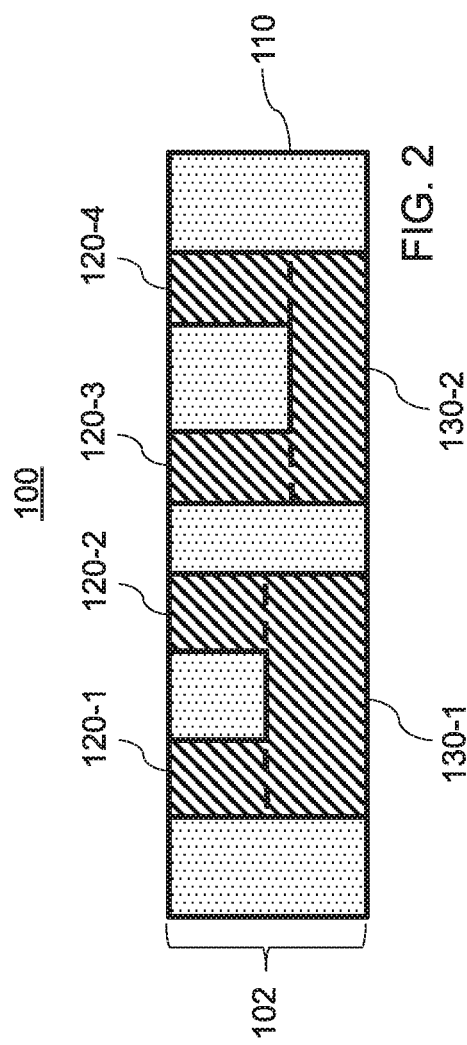

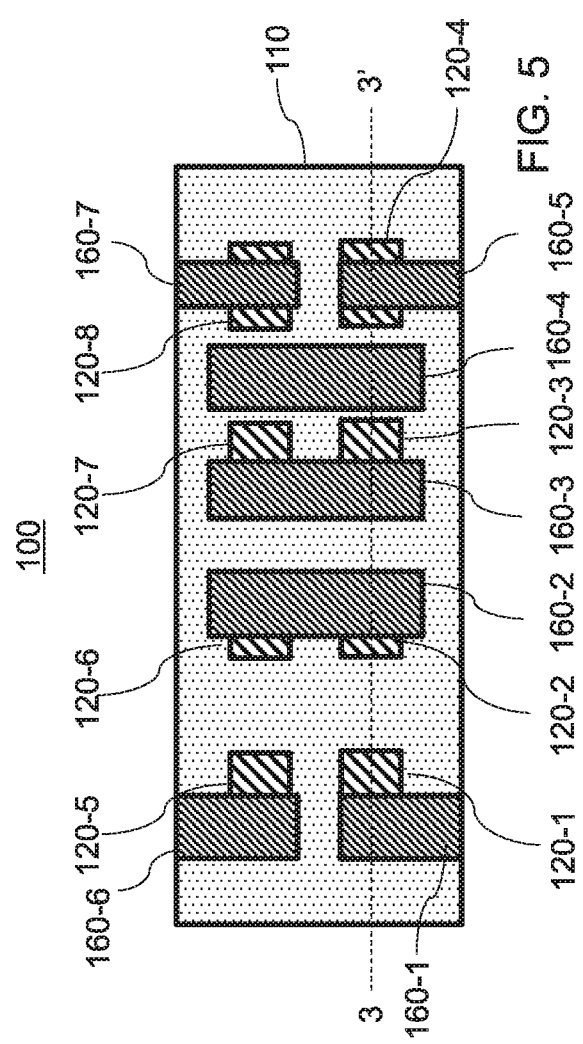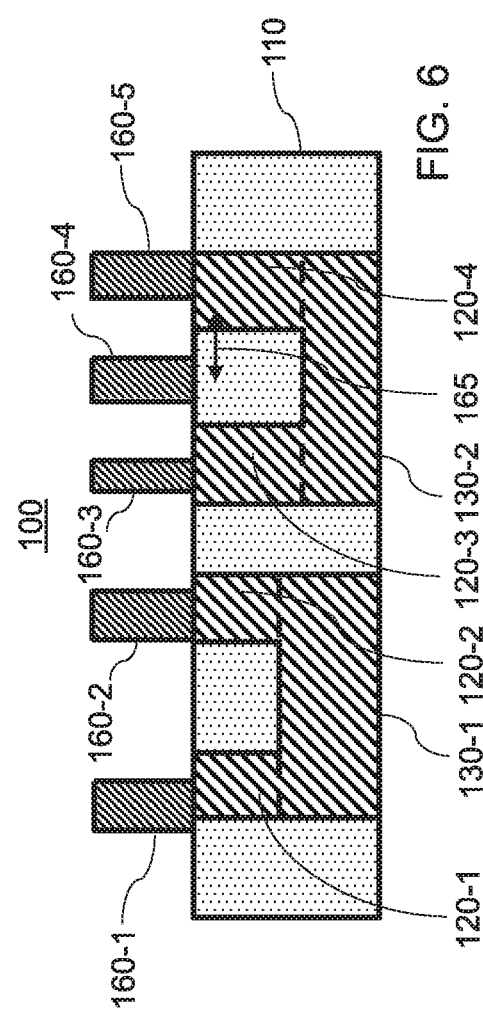

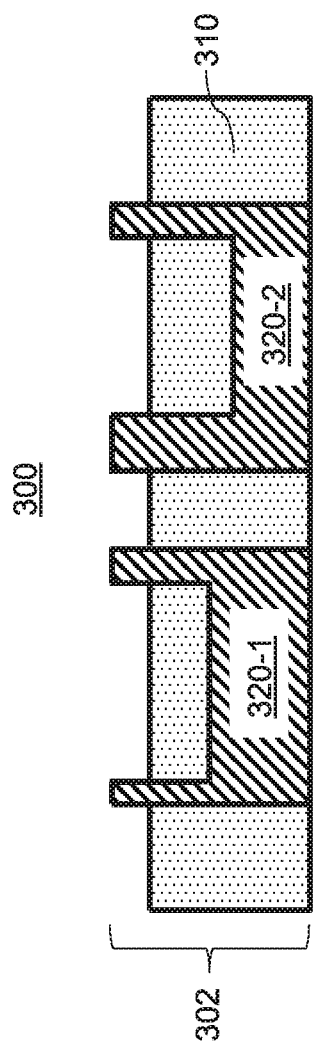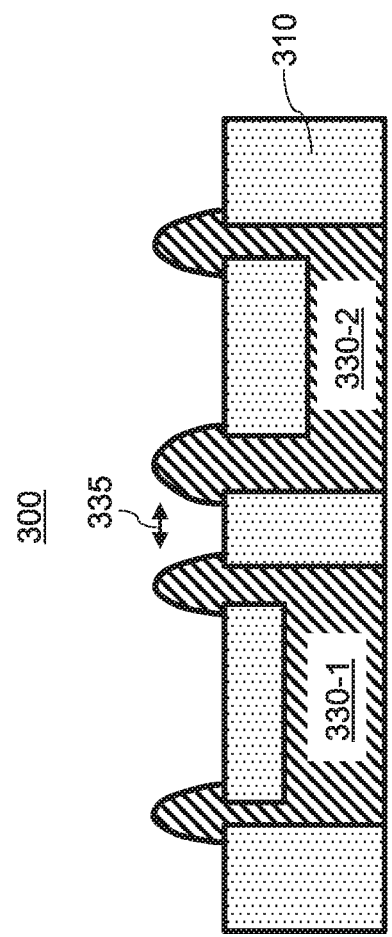

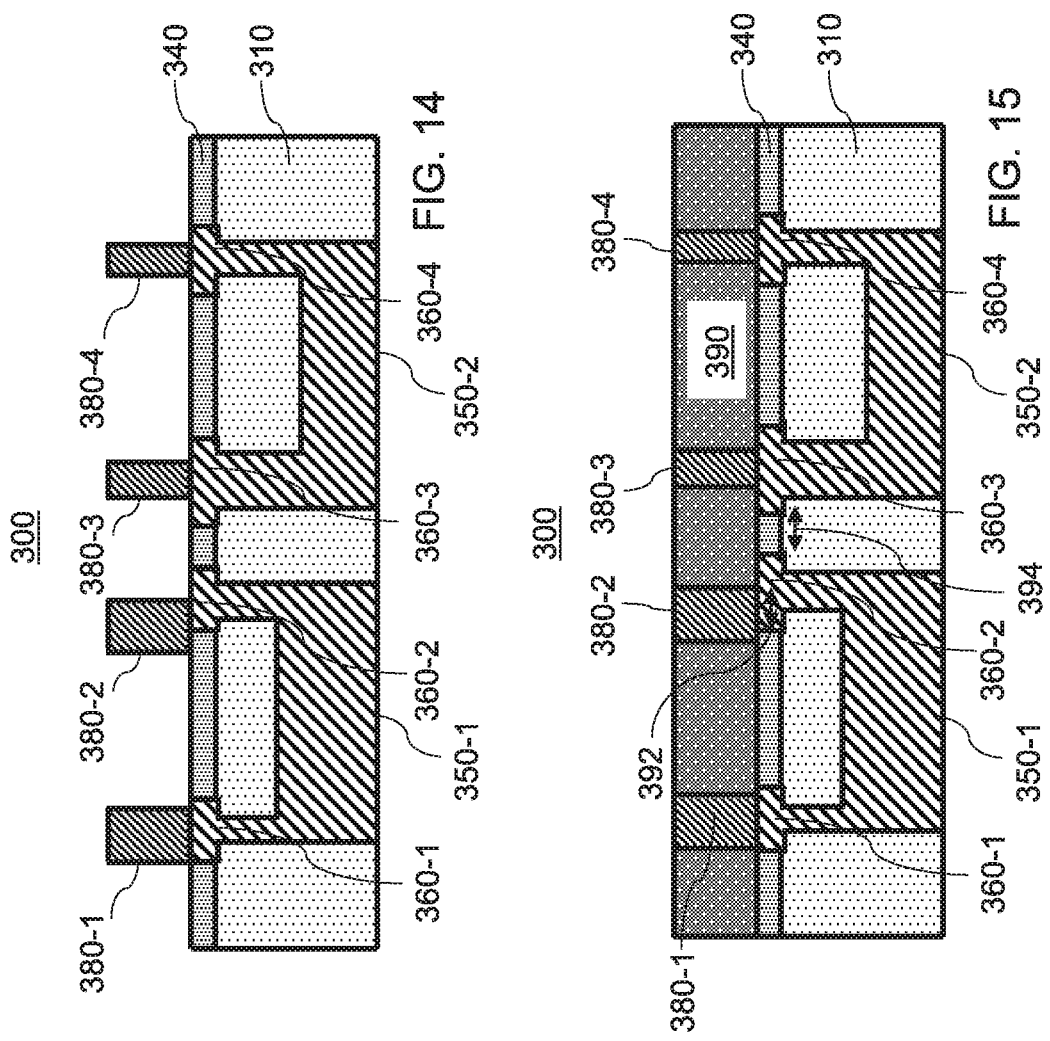

LITHOGRAPHIC ALIGNMENT OF A CONDUCTIVE LINE TO A VIA

BACKGROUND

The present invention generally relates to semiconductor devices, and more particularly to semiconductor devices including conductive lines and vias and methods of forming the same.

Lithographic alignment of vias and conductive lines can occur through thick, opaque conductive films (e.g., metal films). At small dimensions, overlay and alignment errors can have a large impact on via contact resistance and dielectric barriers. Critical dimension (CD) variation can introduce additional overlay and alignment fluctuation. For example, the CD of the via can be smaller than the CD of the conductive line (e.g., either the via is too small or the conductive line is too large), the CD of the via can be larger than the CD of the conductive line (e.g., either the via is too large or the conductive line is too small), or misalignment can occur between a via and conductive line (e.g., a via and conductive line having a substantially similar CD) leading to a reduced contact area.

SUMMARY

In accordance with an embodiment of the present invention, a method for fabricating a semiconductor device is provided. The method includes forming misalignment tolerant vias each having a landing area configured to account for alignment mismatch resulting from subsequent formation of conductive structures, depositing a conductive layer over the misalignment tolerant vias, and obtaining conductive layer patterning including each of the conductive structures formed on at least a portion of a respective one of the landing areas, including subtractively patterning the conductive layer. The misalignment tolerant vias and the conductive structures impart a semiconductor device geometry accounting for the alignment mismatch.

In accordance with another embodiment of the present invention, a semiconductor device is provided. The device includes a base structure including misalignment tolerant vias each having a landing area configured to account for alignment mismatch. At least one of the misalignment tolerant vias is an upsized via exceeding a standard via size for a corresponding pitch. The device further includes conductive structures each disposed on at least a portion of a respective one of the landing areas. The misalignment tolerant vias and the conductive structures imparting a semiconductor device geometry accounting for misalignment effects.

In accordance with yet another embodiment of the present invention, a semiconductor device is provided. The device includes misalignment tolerant vias each having a landing area configured to account for alignment mismatch, and conductive structures each disposed on at least a portion of a respective one of the landing areas. The misalignment tolerant vias and the conductive structures impart a semiconductor device geometry accounting for the alignment mismatch. The geometry includes a margin measured between the misalignment tolerant vias and the conductive structures.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 1 is a top-down view of the formation of a base structure during the fabrication of a semiconductor device, in accordance with an embodiment of the present invention;

FIG. 2 is a cross-sectional view of the device shown in FIG. 1, in accordance with an embodiment of the present invention;

FIG. 5 is a top-down view of a subtractive etch conductive line pattern transfer performed during the fabrication of the semiconductor device, in accordance with an embodiment of the present invention;

FIG. 6 is a cross-sectional view of the semiconductor device shown in FIG. 5, in accordance with an embodiment of the present invention;

FIG. 10 is a cross-sectional view of the formation of a base structure during the fabrication of a semiconductor device, in accordance with another embodiment of the present invention;

FIG. 11 is a cross-sectional view of the formation of additional conductive material during the fabrication of the semiconductor device, in accordance with another embodiment of the present invention;

FIG. 14 is a cross-sectional view of upper conductive line patterning performed on the upper conductive material during the fabrication of the semiconductor device, in accordance with another embodiment of the present invention;

FIG. 15 is a cross-sectional view of the formation of an upper dielectric layer during the fabrication of the semiconductor device, in accordance with another embodiment of the present invention.

DETAILED DESCRIPTION

Figure 3:
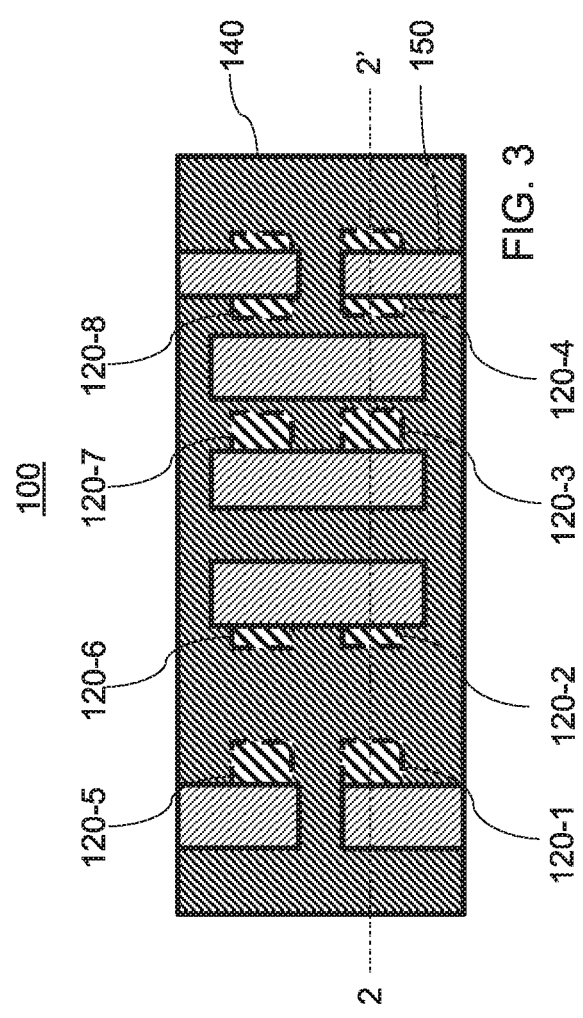
FIG. 3 is a top-down view of the formation of conductive pattern lines during the fabrication of the semiconductor device, in accordance with an embodiment of the present invention.

The embodiments described herein provide for a subtractive patterning approach for aligning an upper conductive line (e.g., metal line) to a top via. More specifically, the embodiments described herein aid alignment by upsizing the top via and, more specifically, by widening the critical dimension (CD) of the top via along the direction of the bottom conductive line (e.g., upsized along a single direction). Accordingly, lithography can be used to print non-square (e.g., rectangular) vias in accordance with the embodiments described herein.

As used herein, the term "upsizing" can refer to making the via larger by design for a technology node or pitch. For example, for a 36 nm pitch, an upsized via can be enlarged to, e.g., 22 nm or 28 nm, from a more typical 18 nm. Moreover, "upsizing" can be further defined relative to the dielectric spacing and line CDs. For example, a via can be considered upsized if the via is designed to be larger/wider than the contacting conductive line. The formation of an upsized via would be mostly in the mask design/layout itself. The upsizing of the via can ensure contact area definition by the CD of the upper conductive line.

The subtractive patterning approach described herein can reduce overlay and/or alignment errors that can lead to dielectric breakdown (e.g., not enough dielectric barrier spacing and shortening) or large via resistance due to reduced contact area. To resolve issues pertaining to the reduction of dielectric barrier spacing between adjacent vias and conductive lines as a result of the upsized via, intentional overetch can be used when transferring the upper conductive lines in accordance with the embodiments described herein to increase dielectric barrier spacing. "Overetch" can be defined by the line formation of the upper conductive line reaching/etching into the layer below. To this end, the top via size can be increased along the lower conductive lines, which can allow for an increase in contact area. Thus, the top via contact area can be defined by the CD of the upper conductive line, thereby minimizing overlay error variations.

Additionally, the upper conductive line can be intentionally or purposefully overetched into the underlayer to cut off any exposed via extension at the top, thereby increasing the dielectric barrier, preventing breakdown and negating drawbacks due to the larger upsized via. Accordingly, the embodiments described herein can increase overlay margin by upsizing the via along the conductive line and can increase dielectric barrier margin by overetching the conductive line patterning. As used herein, the term "increased overlay error margin" refers to being able to have a high-performing device even if the lithographic overlay/alignment is large relative to CD and pitch. For example, if the overlay/alignment error is similar or close to the dielectric spacing, performance can be severely limited. However, in accordance with the embodiments described herein, a high performance can be achieved even if the error and spacing are of a similar dimension.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a top-down view of a semiconductor device 100 is provided and, with reference to FIG. 2, a cross-sectional view of the device 100 through line 1-1' of FIG. 1 is provided.

The device 100 is shown including a base structure 102. More specifically, the base structure 102 includes a lower dielectric layer 110. The lower dielectric layer 110 can include any suitable dielectric material in accordance with the embodiments described herein. For example, the lower dielectric layer 110 can include, e.g., silicon dioxide ($SiO_2$), low-k dielectrics, nitride layers, and combinations thereof. In one embodiment, the lower dielectric layer 110 can include an ultra low-k dielectric (ULK) material. For example, the lower dielectric layer 110 can include a dielectric material having a dielectric constant, k, less than or equal to, e.g., about 2.5.

As further shown, the base structure 102 further includes conductive material formed within the lower dielectric layer 110. In one embodiment, the conductive material includes a metal. As can be seen in FIG. 1, the conductive material includes a plurality of vias, including vias 120-1 through 120-8. However, as will be further described below with reference to FIG. 2, the conductive material further includes lower conductive lines (not shown). Examples of suitable conductive materials that can be used to form the vias 120-1 through 120-8 (and the lower conductive lines) include, but are not limited to, copper (Cu), tungsten (W), ruthenium (Ru), cobalt (Co), aluminum (Al), etc. The conductive material further includes a lower conductive line 130-1 corresponding to the vias 120-1 and 120-2, and a lower conductive line 130-2 corresponding to the vias 120-3 and 120-4.

The vias 120-1 through 120-4 are upsized along their respective lower conductive lines 130-1 and 130-2. More specifically, the vias 120-1 through 120-4 can be upsized to include a quarter pitch on each side, or a half pitch extra. For example, the vias 120-1 through 120-48 can have a thickness between, e.g., about 15 nm to about 30 nm.

For example, the device layout can be designed with via critical dimensions (CDs) extended along the lower conductive lines 130-1 and 130-2 in tight pitch features. That is, each via can be designed larger than the contacting conductive line. Via upsizing can be achieved at the lithography printing step, by printing the vias larger than designed.

The lower conductive lines 130-1 and 130-2 and the plurality of vias 120-1 through 120-8 can be formed using any suitable process in accordance with the embodiments described herein. For example, the lower conductive lines 130-1 and 130-2 and the plurality of vias 120-1 through 120-8 can be formed using, e.g., a damascene or subtractive process.

With reference to FIG. 3, a top-down view of the device 100 is provided illustrating the formation of upper conductive material 140 on the base structure 102, and a plurality of masks, including a mask 150, on the upper conductive material 140.

In one embodiment, the upper conductive material 140 includes a metal. Examples of suitable conductive materials that can be used to form the upper conductive material 140 include, but are not limited to, Cu, W, Ru, Co, Al, etc.

The plurality of masks 150 can include any suitable material in accordance with the embodiments described herein. For example, plurality of masks 150 can include, e.g., silicon oxides, silicon carbides, silicon nitrides, silicon carbonitrides, spin-on dielectrics, etc. Spin-on dielectrics that can be utilized as material for the plurality of masks 150 include, but are not limited to, silsequioxanes, siloxanes, and boron phosphate silicate glass (BPSG). The pattern in masks 150 can be formed using any suitable lithography process (e.g., deep UV or extreme UV lithography) with any suitable lithography stack (not shown).

Although the upper conductive material 140 is formed to cover the plurality of vias 120-1 through 120-8, an outline of the plurality of vias 120-1 through 120-8 is shown to illustrate the relationship of the position of the plurality of masks relative to the plurality of vias 120-1 through 120-8 underneath the upper conductive material 140.

Figure 4:
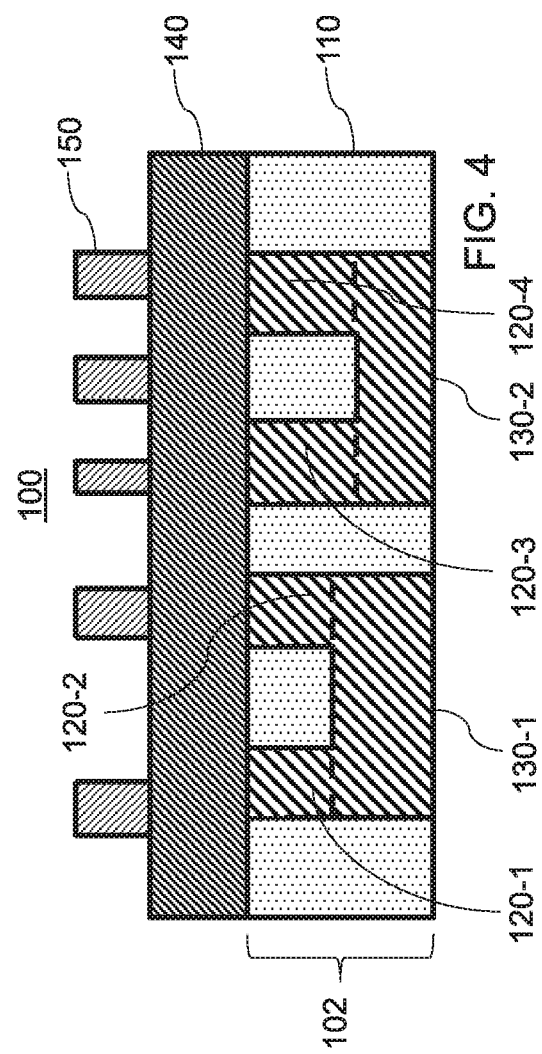
FIG. 4 is a cross-sectional view of the semiconductor device shown in FIG. 3, in accordance with an embodiment of the present invention.

With reference to FIG. 4 a cross-sectional view of the device 100 through line 2-2' of FIG. 3 is provided. The line 2-2' defines a cross-section through the vias 120-1 through 120-4 shown in FIG. 3.

As mentioned above in FIG. 3, the device 100 includes the upper conductive material 140 formed on the base structure 102, and the plurality of masks, including the mask 150, formed on the upper conductive material 140. As shown in FIG. 4, the plurality of masks protect portions of the upper conductive material 140 and define patterning regions for removing unprotected portions of the upper conductive material 140 during a subsequent patterning process, which will now be described below with reference to FIG. 5.

With reference to FIG. 5, a top-down view of the device 100 is provided illustrating the patterning of the upper conductive material 140 and the removal of the plurality of masks 150 to obtain an upper conductive line patterning. In one embodiment, a subtractive etch line pattern transfer process is performed to obtain the upper conductive line patterning. However, any suitable process can be used to form the plurality of conductive portions in accordance with the embodiments described herein (e.g., damascene process).

As shown, the upper conductive line patterning includes a plurality of upper conductive lines 160-1 through 160-7. In this example, the upper conductive line 160-1 is disposed on the via 120-1, the upper conductive line 160-2 is disposed on the vias 120-2 and 120-6, the upper conductive line 160-3 is disposed on the vias 120-3 and 120-7, the upper conductive line 160-4 is disposed between the vias 120-4 and 120-8, the upper conductive line 160-5 is disposed on the via 120-8, the upper conductive line 160-6 is disposed on the vias 120-5, and the upper conductive line 160-7 is disposed on the via 120-2.

As will be described in further detail below with reference to FIG. 6, the upper conductive line patterning can introduce one or more misalignment errors between one or more of the upper conductive lines 160-1 through 160-7 and corresponding ones of the plurality of vias 120-1 through 120-8. Such misalignment(s) can have a large impact on via contact resistance and dielectric barriers. Additionally, the upper conductive line patterning can introduce critical dimension (CD) variation. Such CD variation can introduce additional overlay and alignment fluctuation.

With reference to FIG. 6, a cross-sectional view of the device 100 through line 3-3' of FIG. 5 is provided. The line 3-3' defines a cross-section through the vias 120-1 through 120-4 and the upper conductive lines 160-1 through 160-5 shown in FIG. 5.

As shown in this illustrative example, the patterning process to obtain the upper conductive line patterning introduced a misalignment between the upper conductive line 160-1 and the via 120-1. As mentioned above with reference to FIG. 5, such misalignment can have a large impact on via contact resistance and dielectric barriers. Additionally, the patterning introduced CD variation with respect to the upper conductive lines 160-3 and 160-5. As mentioned above with reference to FIG. 5, such CD variation can introduce additional overlay and alignment fluctuation.

Due to the upsized via thickness along the lower conductive lines, an improved dielectric spacing of the upper conductive patterning resulting from the patterning process, indicated by arrow 165, can be achieved. For example, the dielectric spacing corresponding to arrow 165 can range from, e.g., about 5 nm to about 15 nm.

Figure 7:
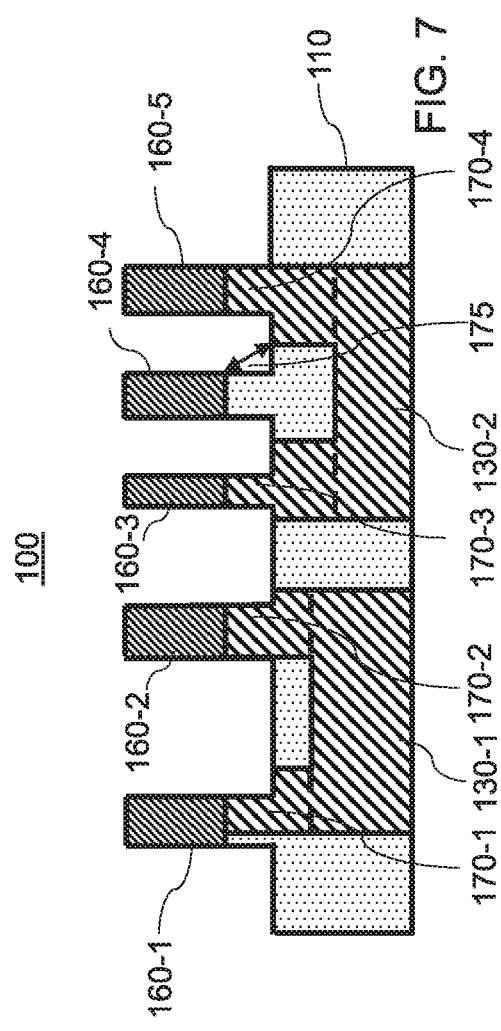
FIG. 7 is a cross-sectional view of overetch upper conductive line patterning performed during the fabrication of the semiconductor device, in accordance with an embodiment of the present invention.

With reference to FIG. 7, to address the misalignment and small line CD concerns described above with reference to FIG. 6, the upper conductive line patterning is intentionally or purposefully overetched. The overetching etches back the exposed via structures, thereby increasing overlay error margin and dielectric barrier margin.

The dielectric spacing of the upper conductive patterning resulting from the overetching, indicated by arrow 175, can reduce the risk of shorting. For example, the dielectric spacing corresponding to arrow 175 can range from, e.g., about 5 nm to about 15 nm. Accordingly, the device 100 includes a geometry accounting for misalignment effects.

Figure 8:
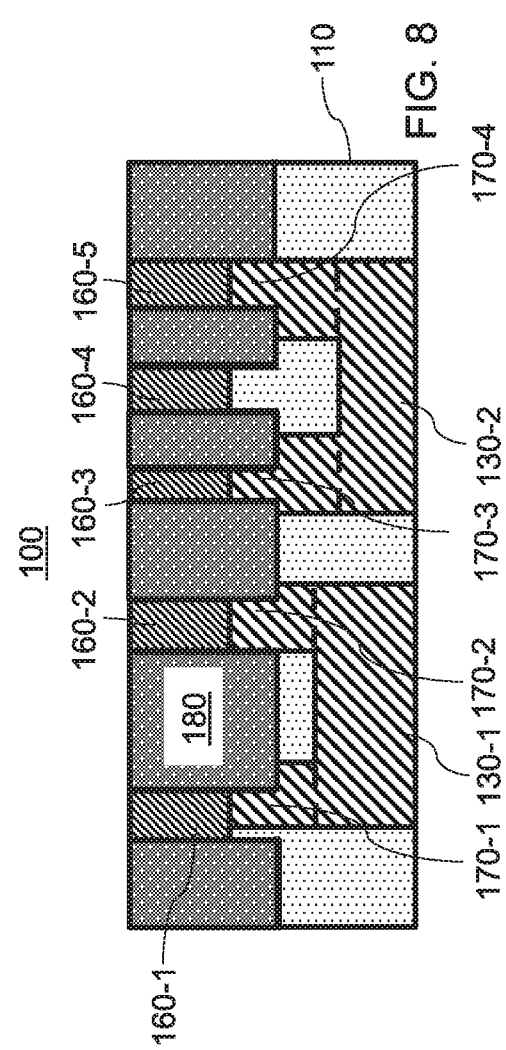
FIG. 8 is a cross-sectional view of the formation of a dielectric material after the overetching during the fabrication of the semiconductor device, in accordance with an embodiment of the present invention.

With reference to FIG. 8, an upper dielectric layer 180 is formed. The upper dielectric layer 180 can be formed by filling spaces of the device 100 with dielectric material and planarizing the dielectric material. The upper dielectric layer 180 can include any suitable dielectric material in accordance with the embodiments described herein. For example, the upper dielectric layer 180 can include, e.g., $SiO_2$, low-k dielectrics, nitride layers, and combinations thereof. In one embodiment, the upper dielectric layer 180 can include a ULK material. In one embodiment, the upper dielectric layer 180 can include the same material as the lower dielectric layer 110. In another embodiment, the upper dielectric layer 180 can include a different material from the lower dielectric layer 110.

Figure 9:
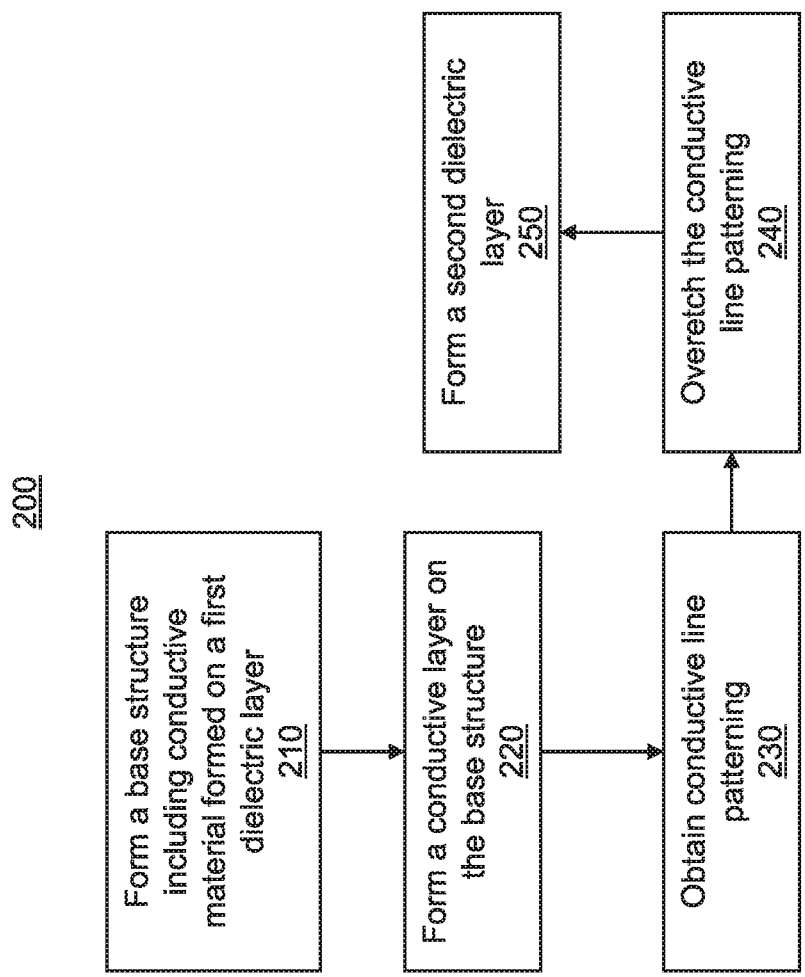
FIG. 9 is a block/flow diagram illustrating a system/method for fabricating a semiconductor device, in accordance with an embodiment of the present invention.

With reference to FIG. 9, a block/flow diagram is shown illustrating a system/method 200 for fabricating a semiconductor device including self-aligned vias and self-aligned blocks, in accordance with an embodiment.

At block 210, a base structure is formed including conductive material formed on a first dielectric layer. The first dielectric layer can include any suitable dielectric material in accordance with the embodiments described herein. For example, the first dielectric layer can include, e.g., $SiO_2$, low-k dielectrics, nitride layers, and combinations thereof. In one embodiment, the first dielectric layer can include a ULK material.

The conductive material can include conductive lines and misalignment tolerant vias each having a landing area configured to account for alignment mismatch. In one embodiment, the conductive material includes a metal. Examples of suitable conductive materials that can be used to include, but are not limited to, Cu, W, Ru, Co, Al, etc. The conductive material can be formed using any suitable process in accordance with the embodiments described herein. For example, the conductive material can be formed using, e.g., a damascene or subtractive process.

At least one of the misalignment tolerant vias can be an upsized via exceeding a standard via size for a corresponding pitch. For example, as described above, the device layout can be designed with via CDs extended along the one or more lower conductive lines in tight pitch features. That is, each via can be designed larger than the contacting conductive line. Via upsizing can be achieved at the lithography printing step, by printing the vias larger than designed.

Further details regarding block 210 are described above with reference to FIGS. 1 and 2.

At block 220, a conductive layer is formed on the base structure. In one embodiment, conductive layer includes a metal. Examples of suitable conductive materials that can be used to form the conductive layer include, but are not limited to, Cu, W, Ru, Co, Al, etc. Further details regarding block 220 are described above with reference to FIGS. 3 and 4

At block 230, conductive line patterning is obtained. The conductive line patterning can include conductive structures (e.g., conductive lines). Each of the conductive structures is formed on at least a portion a respective one of the landing areas of the misalignment tolerant vias.

The conductive line patterning can be obtained by forming masks on the conductive layer, subtractively patterning the conductive layer, and removing the masks after the patterning. For example, a subtractive etch line pattern transfer process is performed to pattern the conductive layer. However, any suitable process can be used to form the conductive line patterning in accordance with the embodiments described herein (e.g., damascene process).

As described above with reference to FIGS. 5 and 6, the conductive line patterning can introduce misalignment errors between the conductive structures and corresponding ones of the misalignment tolerant vias. Such misalignment(s) can have a large impact on via contact resistance and dielectric barriers. Additionally, the conductive line patterning can introduce CD variation. Such CD variation can introduce additional overlay and alignment fluctuation. Due to the upsized via thickness, an improved dielectric spacing of the conductive patterning resulting from the patterning process can be achieved. Accordingly, the formation of the misalignment tolerant vias and the conductive structures imparts a semiconductor device geometry accounting for misalignment effects.

Further details regarding block 230 are described above with reference to FIGS. 4-6.

At block 240, the conductive line patterning is overetched. The overetching etches back the exposed via structures, thereby increasing overlay error margin and dielectric barrier margin. The dielectric spacing of the conductive patterning that results from the overetching can reduce the risk of shorting. Further details regarding block 240 are described above with reference to FIG. 7.

At block 250, a second dielectric layer is formed. The second dielectric layer can be formed by filling spaces with dielectric material and planarizing the dielectric material. Further details regarding block 250 are described above with reference to FIG. 8.

An alternative process flow for fabricating a semiconductor device including self-aligned vias and self-aligned blocks will now be described with reference to FIGS. 10-16. In this illustrative embodiment, the misalignment tolerant vias are not formed as one or more upsized vias using lithography. Rather, as will be described in further detail below, the misalignment tolerant vias can be of any suitable size, and selective deposition can be used to increase the top surface area of the via to account for misalignment.

With reference to FIG. 10, a cross-sectional view of a semiconductor device 300 is provided. The device 300 is shown including a base structure 302. More specifically, the base structure 302 includes a base dielectric layer 310. The base dielectric layer 310 can include any suitable dielectric material in accordance with the embodiments described herein. For example, the base dielectric layer 310 can include, e.g., SiO$_2$, low-k dielectrics, nitride layers, and combinations thereof. In one embodiment, the lower dielectric layer 310 can include a ULK material. For example, the base dielectric layer 310 can include a dielectric material having a dielectric constant, k, less than or equal to, e.g., about 2.5.

As further shown, the base structure 302 further includes conductive layers 320-1 and 320-2 formed within the base dielectric material 310. In one embodiment, the conductive layers 320-1 and 320-2 include a metal. As will be described in further detail below, the conductive layers 320-1 and 320-2 will be used to form a plurality of lower conductive lines and a plurality of vias. Examples of suitable conductive materials that can be used to form the conductive layers 320-1 and 320-2 include, but are not limited to, copper (Cu), tungsten (W), ruthenium (Ru), cobalt (Co) and/or aluminum (Al).

With reference to FIG. 11, additional conductive material is formed on the conductive layers 320-1 and 320-1, resulting in the formation of modified conductive layers 330-1 and 330-2. The additional conductive material can be formed using a selective deposition technique. As shown, the modified conductive layers 330-1 and 330-2 are formed having a rounded top. Any suitable technique can be used to form the modified conductive layers 330-1 and 330-2 in accordance with the embodiments described herein.

As further shown in FIG. 11, arrow 335 indicates a spacing between the conductive layers 320-1 and 320-2. Assuming that the dielectric spacing between the two vias ("via spacing") is at minimal ground rule, the length corresponding to the arrow 335 can be below the minimal ground rule, leading to possible shorting and breakdown. For example, for an approximately 36 nm pitch, the via spacing could be, e.g., about 20 nm and, with selective deposition, the length corresponding to the arrow 335 could shrink down to, e.g., about 12 nm.

Figure 12:
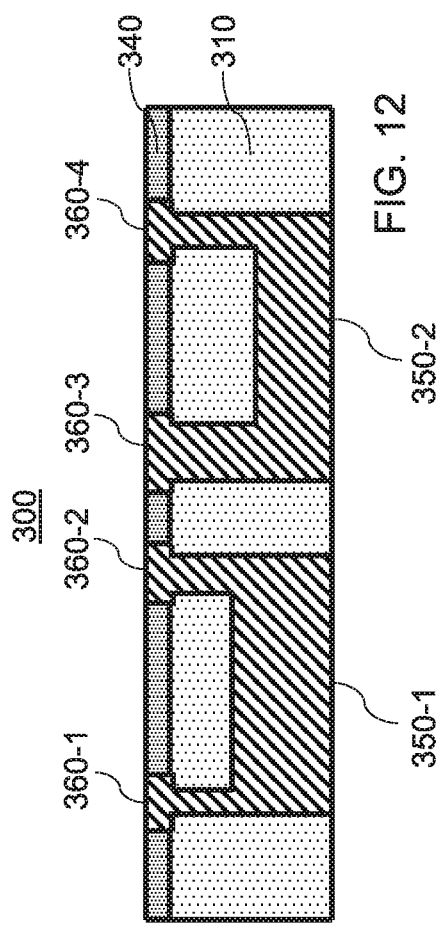
FIG. 12 is a cross-sectional view of the formation of dielectric material during the fabrication of the semiconductor device, in accordance with another embodiment of the present invention.

With reference to FIG. 12, a dielectric fill is formed and a planarization process (e.g., chemical-mechanical planarization (CMP)) is performed to remove portions of the dielectric fill and the modified conductive layers 330-1 and 330-1, thereby forming lower dielectric layer 340 and conductive material including lower conductive lines 350-1 and 350-2 and vias 360-1 through 360-4. More specifically, vias 360-1 and via 360-2 are associated with the lower conductive line 350-1, and vias 360-3 and 360-4 are associated with the lower conductive line 350-2. Any suitable process can be used to form the lower dielectric layer 340, the lower conductive lines 350-1 and 350-2, and the vias 360-1 through 360-4 in accordance with the embodiments described herein.

The lower dielectric layer 340 can include any suitable dielectric material in accordance with the embodiments described herein. For example, the lower dielectric layer 340 can include, e.g., SiO$_2$, low-k dielectrics, nitride layers, and combinations thereof (e.g., a ULK material). In one embodiment, the lower dielectric layer 340 can include a same material as the base dielectric layer 310. In another embodiment, the lower dielectric layer 340 can include a different material from the base dielectric layer 310.

Figure 13:
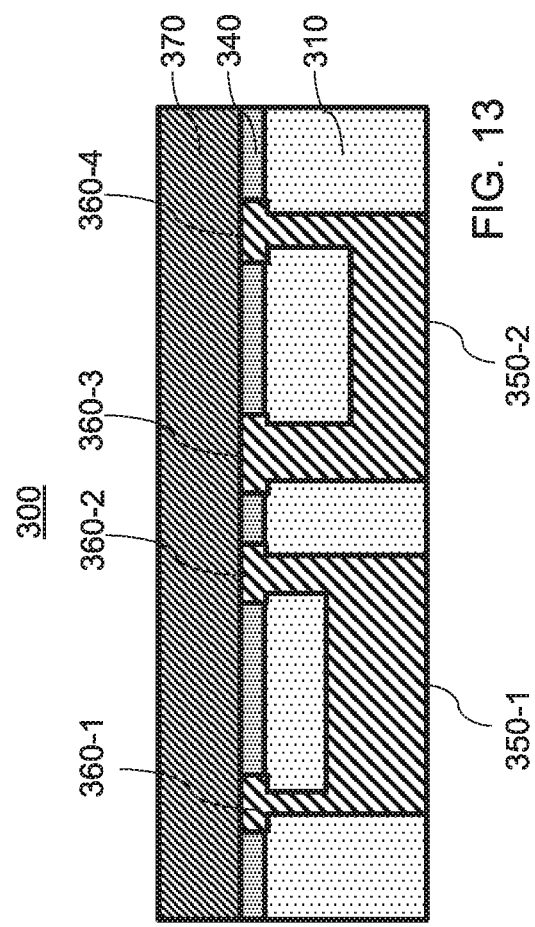
FIG. 13 is a cross-sectional view of the formation of upper conductive material during the fabrication of the semiconductor device, in accordance with another embodiment of the present invention.

With reference to FIG. 13, upper conductive material 370 is formed on the lower dielectric layer 340 and the vias 360-1 through 360-4. In one embodiment, the upper conductive material 370 includes a metal. Examples of suitable conductive materials that can be used to form the upper conductive layer 370 include, but are not limited to, Cu, W, Ru, Co, Al, etc.

With reference to FIG. 14, the upper conductive material 370 is patterned to obtain an upper conductive line patterning. For example, a plurality of masks can be formed to protect portions of the upper conductive material 370 and define patterning regions for removing unprotected portions of the upper conductive material 370. In one embodiment, a subtractive etch line pattern transfer process is performed to obtain the upper conductive line patterning. However, any suitable process can be used to form the plurality of conductive portions in accordance with the embodiments described herein (e.g., damascene process).

As shown, the upper conductive line patterning includes a plurality of upper conductive lines 380-1 through 380-4. In this example, the upper conductive line 380-1 is disposed on the via 360-1, the upper conductive line 380-2 is disposed on the vias 360-2, the upper conductive line 380-3 is disposed on the via 360-3, and the upper conductive line 160-4 is disposed on the via 360-4.

The upper conductive line patterning can include misalignment errors between one or more of the upper conductive lines 380-1 through 380-4 and corresponding ones of the vias 360-1 through 360-4. Such misalignment(s) can have a large impact on via contact resistance and dielectric barriers. Additionally, the upper conductive line patterning can introduce CD variation. Such CD variation can introduce additional overlay and alignment fluctuation. In this illustrative example, the via 360-1 has a small CD relative to the upper conductive line 380-1, the upper conductive line 380-2 is misaligned with respect to the via 360-2, and the upper conductive lines 380-3 and 380-4 have smaller CDs relative to their corresponding vias 360-3 and 360-4, respectively.

With reference to FIG. 15, an upper dielectric layer 390 is formed. The upper dielectric layer 390 can be formed by filling spaces of the device 300 with dielectric material and planarizing the dielectric material. The upper dielectric layer 390 can include any suitable dielectric material in accordance with the embodiments described herein. For example, the upper dielectric layer 390 can include, e.g., $SiO_2$, low-k dielectrics, nitride layers, and combinations thereof. In one embodiment, the upper dielectric layer 390 can include a ULK material. In one embodiment, the upper dielectric layer 390 can include the same material as the base dielectric layer 310 and/or the lower dielectric layer 340. In another embodiment, the upper dielectric layer 390 can include a different material from the base dielectric layer 310 and/or the lower dielectric layer 340.

Arrow 392 refers to the extra error margin that is gained, and arrow 394 refers to an area of possible dielectric breakdown due to narrow spacing. That is, the extra margin that is gained corresponds to a loss in dielectric spacing. For example, for an approximately 36 nm pitch and approximate 12 nm via spacing, arrow 392 can correspond to a length of, e.g., about 4 nm and arrow 394 can correspond to a length of, e.g., about 12 nm. Accordingly, the device 300 includes a geometry accounting for misalignment effects.

Figure 16:
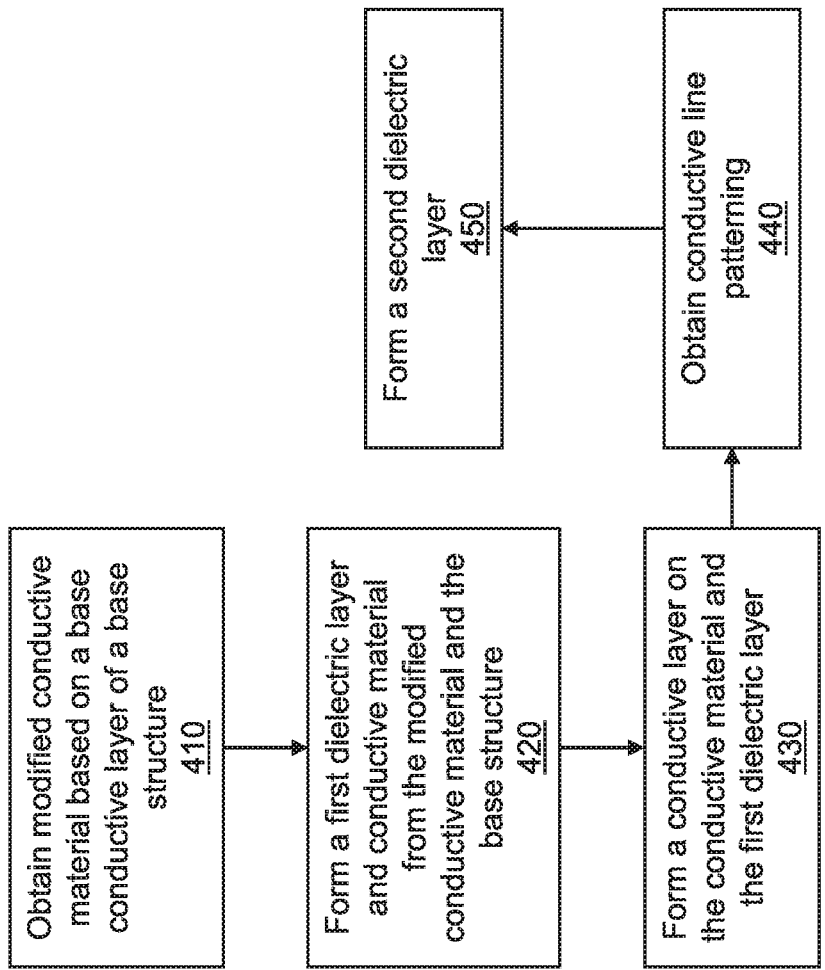
FIG. 16 is a block/flow diagram illustrating a system/method for fabricating a semiconductor device, in accordance with another embodiment of the present invention.

With reference to FIG. 16, a block/flow diagram is shown illustrating a system/method 400 for fabricating a semiconductor device including self-aligned vias and self-aligned blocks, in accordance with another embodiment. In this illustrative embodiment, lithography is not used to upsize at least one via to account for misalignment. Rather, as will be described in further detail below, the vias can be of any suitable size, and selective deposition is used to increase the top surface area of the via to account for misalignment.

At block 410, modified conductive material is obtained based on a base conductive layer of a base structure. Obtaining the modified conductive material can include forming additional conductive material on the base conductive layer. The base structure can further include a base dielectric layer, and the base conductive layers can be formed within the base dielectric layer. The additional conductive material can be formed using a selective deposition technique. Any suitable technique can be used to form the modified conductive material in accordance with the embodiments described herein.

The modified conductive material can include rounded tops. Assuming that via spacing is at minimal ground rule, a distance between the rounded tops can be below the minimal ground rule, leading to possible shorting and breakdown. For example, for an approximately 36 nm pitch, the via spacing could be, e.g., about 20 nm and, with selective deposition, distance between the rounded tops could shrink down to, e.g., about 12 nm.

The base dielectric layer can include any suitable dielectric material in accordance with the embodiments described herein. For example, the base dielectric layer can include, e.g., $SiO_2$, low-k dielectrics, nitride layers, and combinations thereof. In one embodiment, the base dielectric layer can include a ULK material. The conductive material can include a metal. Examples of suitable conductive materials include, but are not limited to, Cu, W, Ru, Co, Al, etc.

Further details regarding block 410 are described above with reference to FIGS. 10 and 11.

At block 420, a first dielectric layer and conductive material are formed from the modified conductive material and the base structure. More specifically, a dielectric fill can be formed, and a planarization process (e.g., CMP) can be performed to remove portions of the dielectric fill and the modified conductive material. The conductive material can include conductive lines and misalignment tolerant vias corresponding to respective ones of the conductive lines. The misalignment tolerant vias each have a landing area configured to account for alignment mismatch.

Any suitable process can be used to form the first dielectric layer and the conductive material in accordance with the embodiments described herein. The first dielectric layer can include any suitable dielectric material in accordance with the embodiments described herein. For example, the dielectric layer can include, e.g., $SiO_2$, low-k dielectrics, nitride layers, and combinations thereof (e.g., a ULK material). In one embodiment, the first dielectric layer can include a same material as the base dielectric layer. In another embodiment, the first dielectric layer can include a different material from the base dielectric layer. Further details regarding block 420 are described above with reference to FIG. 12.

At block 430, a conductive layer is formed on the conductive material and the first dielectric layer. In one embodiment, the conductive layer includes a metal. Examples of suitable conductive materials that can be used to form the conductive layer include, but are not limited to, Cu, W, Ru, Co, Al, etc. Further details regarding block 430 are described above with reference to FIG. 13.

At block 440, conductive line patterning is obtained. The conductive line patterning can include conductive structures (e.g., conductive lines). Each of the conductive structures is formed on at least a portion a respective one of the landing areas of the misalignment tolerant vias.

The conductive line patterning can be obtained by forming masks on the conductive layer, subtractively patterning the conductive layer, and removing the masks after the patterning. For example, a subtractive etch line pattern transfer process is performed to pattern the conductive layer. However, any suitable process can be used to form the conductive line patterning in accordance with the embodiments described herein (e.g., damascene process).

The conductive line patterning can introduce misalignment errors between the conductive structures and corresponding ones of the misalignment tolerant vias. Such misalignment(s) can have a large impact on via contact resistance and dielectric barriers. Additionally, the conductive line patterning can introduce CD variation. Such CD variation can introduce additional overlay and alignment fluctuation.

Extra error margin that is gained can correspond to a loss in dielectric spacing. For example, for an approximately 36 nm pitch and approximate 12 nm via spacing, arrow 392 can correspond to a length of, e.g., about 4 nm and arrow 394 can correspond to a length of, e.g., about 12 nm. Accordingly, the formation of the misalignment tolerant vias the conductive structures imparts a semiconductor device geometry accounting for misalignment effects.

Further details regarding block 440 are described above with reference to FIGS. 14 and 15.

At block 450, a second dielectric layer is formed. The second dielectric layer can be formed by filling spaces with dielectric material and planarizing the dielectric material. The second dielectric layer can include any suitable dielectric material in accordance with the embodiments described herein. For example, the second dielectric layer can include, e.g., $SiO_2$, low-k dielectrics, nitride layers, and combinations thereof (e.g., a ULK material). In one embodiment, the second dielectric layer can include the same material as the base dielectric layer and/or the first dielectric layer. In another embodiment, the second dielectric layer can include a different material from the base dielectric layer and/or the first dielectric layer. Further details regarding block 450 are described above with reference to FIG. 15.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
   forming, from a base structure and on a conductive line, at least one pair of misalignment tolerant vias each having a landing area configured to account for alignment mismatch resulting from subsequent formation of conductive structures;
   depositing a conductive layer over the at least one pair of misalignment tolerant vias; and
   obtaining conductive layer patterning including each of the conductive structures formed on at least a portion of a respective one of the landing areas, including subtractively patterning the conductive layer;
   the at least one pair of misalignment tolerant vias and the conductive structures imparting a semiconductor device geometry accounting for the alignment mismatch.

2. The method of claim 1, wherein forming the misalignment tolerant vias further includes using lithography to form at least one of the misalignment tolerant vias as an upsized via exceeding a standard via size for a corresponding pitch.

3. The method of claim 2, further comprising forming the base structure by forming conductive material on a first dielectric layer, the conductive material including the misalignment tolerant vias formed at respective ends of the conductive line.

4. The method of claim 3, wherein obtaining the conductive layer patterning further includes:
   forming a mask on the conductive layer prior to the subtractive patterning; and
   removing the mask after the subtractive patterning.

5. The method of claim 4, further comprising overetching the conductive layer patterning to increase overlay error margin and dielectric barrier margin.

6. The method of claim 3, further comprising forming a second dielectric layer.

7. The method of claim 1, wherein forming the at least one pair of misalignment tolerant vias further includes:
   selectively depositing additional conductive material on at least one conductive layer of the base structure to form at least one modified conductive layer including a pair of rounded tops; and
   forming the misalignment tolerant vias by planarizing the modified conductive material.

8. The method of claim 7, wherein the base structure further includes a base dielectric layer, and wherein the at least one conductive layer is formed within the base dielectric layer.

9. The method of claim 7, wherein the misalignment tolerant vias are formed at respective ends of the conductive line.

10. The method of claim 7, further comprising forming a dielectric fill after selectively depositing the additional conductive material, and planarizing the dielectric fill during the formation of the misalignment tolerant vias to form a first dielectric layer.

11. The method of claim 10, wherein the conductive layer is formed on the first dielectric layer and the misalignment tolerant vias.

12. The method of claim 11, wherein forming the conductive structures further includes:
    forming a mask on the conductive layer prior to the subtractive patterning; and
    removing the mask after the subtractive patterning.

13. The method of claim 7, further comprising forming a second dielectric layer.

14. A semiconductor device comprising:
    a base structure including misalignment tolerant vias each having a landing area configured to account for alignment mismatch, at least one of the misalignment tolerant vias being an upsized via exceeding a standard via size for a corresponding pitch; and
    conductive structures each disposed on at least a portion of a respective one of the landing areas;
    the misalignment tolerant vias and the conductive structures imparting a semiconductor device geometry accounting for misalignment effects.

15. The device of claim 14, wherein the base structure further includes a first dielectric layer.

16. The device of claim 15, further comprising a second dielectric layer disposed on the first dielectric layer and adjacent to the misalignment tolerant vias and the conductive structures.

17. A semiconductor device comprising:
    at least one pair of misalignment tolerant vias disposed on a conductive line each having a landing area configured to account for alignment mismatch; and
    conductive structures each disposed on at least a portion of a respective one of the landing areas;
    the misalignment tolerant vias and the conductive structures imparting a semiconductor device geometry accounting for the alignment mismatch, including a margin measured between the misalignment tolerant vias and the conductive structures.

18. The device of claim 17, further comprising:
    a base structure including a base dielectric layer and the conductive line;
    a first dielectric layer disposed on the base dielectric layer and adjacent to the misalignment tolerant vias; and
    a second dielectric layer disposed on the first dielectric layer adjacent to the conductive structures.

19. The device of claim 17, wherein the misalignment tolerant vias are formed at respective ends of the conductive line.

* * * * *